United States Patent
Huang

(10) Patent No.: US 7,170,251 B2
(45) Date of Patent: Jan. 30, 2007

(54) SYSTEM AND METHOD FOR DIAGNOSING A CONTROLLER IN A LIMITED ROTATION MOTOR SYSTEM

(75) Inventor: Yuhong Huang, Acton, MA (US)

(73) Assignee: GSI Group Corporation, Billerica, MA (US)

( * ) Notice: Subject to any disclaimer, the term of this patent is extended or adjusted under 35 U.S.C. 154(b) by 0 days.

(21) Appl. No.: 11/040,332

(22) Filed: Jan. 21, 2005

(65) Prior Publication Data

US 2005/0174124 A1 Aug. 11, 2005

Related U.S. Application Data

(60) Provisional application No. 60/538,842, filed on Jan. 23, 2004, provisional application No. 60/575,255, filed on May 28, 2004, provisional application No. 60/613,962, filed on Sep. 28, 2004.

(51) Int. Cl.
*G05B 11/42* (2006.01)
*G05B 1/03* (2006.01)

(52) U.S. Cl. .................... 318/563; 318/565; 318/601; 318/607; 318/610

(58) Field of Classification Search ............. 318/560, 318/563, 565, 568.19, 568.24, 569, 600–601, 318/606–610, 685, 696; 388/906, 909
See application file for complete search history.

(56) References Cited

U.S. PATENT DOCUMENTS 3,932,794 A 1/1976 Iwako (Continued)

FOREIGN PATENT DOCUMENTS

CA 2359739 4/2003

(Continued)

OTHER PUBLICATIONS

Y.H. Huang et al., "Autotuning of a servowriter head positioning system with minimum positioning error," J. Applied Physics, vol. 79, No. 8, Apr. 1996.

(Continued)

*Primary Examiner*—Bentsu Ro
(74) *Attorney, Agent, or Firm*—Gauthier & Connors, LLP

(57) ABSTRACT

A diagnostic system is disclosed for analyzing a limited rotation motor system. The diagnostic system includes a first transform unit, a second transform unit, a closed loop frequency response unit, and a diagnostic system. The first transform unit is for receiving a first digital signal that is representative of a motor control signal, and is for providing a motor control frequency domain signal that is representative of a frequency domain representation of the motor control signal. The second transform unit is for receiving a second digital signal that is representative of a position detection signal, and is for providing a position detection frequency domain signal that is representative of a frequency domain representation of the position detection signal. The closed loop frequency response unit is for identifying a representation of the frequency response of the limited rotation motor responsive to the position detection frequency domain signal and the motor control frequency domain signals. The diagnostic unit is for comparing the representation of the frequency response with a previously recorded representation of a prior frequency response to identify an error condition with respect to the limited rotation motor system.

21 Claims, 9 Drawing Sheets

U.S. PATENT DOCUMENTS

| | | | |
|---|---|---|---|
| 3,999,043 A | 12/1976 | Reiss et al. |
| 4,151,567 A | 4/1979 | Dorsemagen et al. |
| 4,282,468 A | 8/1981 | Barker et al. |
| 4,398,241 A | 8/1983 | Baker et al. |
| 4,514,671 A | 4/1985 | Louth |
| 4,532,402 A | 7/1985 | Overbeck et al. |
| 4,536,806 A | 8/1985 | Louth |
| 4,624,368 A | 11/1986 | Satake |
| 4,631,605 A | 12/1986 | O'Gwynn |
| 4,646,280 A | 2/1987 | Toyosawa |
| 4,670,653 A | 6/1987 | McConkle et al. |
| 4,809,253 A | 2/1989 | Baas et al. |
| 4,845,698 A | 7/1989 | Baas |
| 4,855,674 A | 8/1989 | Murate et al. |
| 4,864,295 A | 9/1989 | Rohr |
| 4,870,631 A | 9/1989 | Stoddard |
| 4,893,068 A | 1/1990 | Evans, Jr. |
| 4,903,131 A | 2/1990 | Lingemann et al. |
| 4,930,027 A | 5/1990 | Steele et al. |
| 4,956,831 A | 9/1990 | Sarraf et al. |
| 4,961,117 A | 10/1990 | Rumley |
| 4,965,513 A * | 10/1990 | Haynes et al. ............... 324/772 |
| 4,972,344 A | 11/1990 | Stoddard et al. |
| 4,978,909 A | 12/1990 | Hendrix et al. |
| 5,075,875 A | 12/1991 | Love et al. |
| 5,093,608 A | 3/1992 | Kono et al. |
| 5,119,213 A | 6/1992 | Graves et al. |
| 5,122,720 A | 6/1992 | Martinson et al. |
| 5,167,002 A | 11/1992 | Fridhandler |
| 5,185,676 A | 2/1993 | Nishiberi et al. |
| 5,187,364 A | 2/1993 | Blais |
| 5,225,770 A | 7/1993 | Montagu |
| 5,229,574 A | 7/1993 | Stone |
| 5,245,528 A | 9/1993 | Saito et al. |
| 5,257,041 A | 10/1993 | Kresock et al. |
| 5,275,041 A | 1/1994 | Poulsen |
| 5,280,377 A | 1/1994 | Chandler et al. |
| 5,285,378 A | 2/1994 | Matsumoto |
| 5,293,102 A | 3/1994 | Martinson et al. |
| 5,313,147 A | 5/1994 | Yoneda et al. |
| 5,331,264 A | 7/1994 | Cheng et al. |
| 5,375,186 A | 12/1994 | Schuettpelz |
| 5,406,496 A | 4/1995 | Quinn et al. |
| 5,424,526 A | 6/1995 | Leonhardt et al. |
| 5,424,632 A | 6/1995 | Montagu |
| 5,452,285 A | 9/1995 | Monen |
| 5,453,618 A | 9/1995 | Sutton et al. |
| 5,523,701 A | 6/1996 | Smith et al. |
| 5,534,071 A | 7/1996 | Varshney et al. |
| 5,537,109 A | 7/1996 | Dowd |
| 5,541,486 A | 7/1996 | Zoller et al. |
| 5,568,377 A | 10/1996 | Seem et al. |
| 5,576,632 A | 11/1996 | Petsche et al. |
| 5,585,976 A | 12/1996 | Pham |
| 5,589,870 A | 12/1996 | Curry et al. |
| 5,600,121 A | 2/1997 | Kahn et al. |
| 5,604,516 A | 2/1997 | Herrod et al. |
| 5,610,487 A | 3/1997 | Hutsell |
| 5,629,870 A | 5/1997 | Farag et al. |
| 5,646,765 A | 7/1997 | Laakmann et al. |
| 5,653,900 A | 8/1997 | Clement et al. |
| 5,656,908 A | 8/1997 | Rehm |
| 5,699,494 A | 12/1997 | Colbert et al. |
| 5,726,883 A | 3/1998 | Levine et al. |
| 5,726,905 A | 3/1998 | Yazici et al. |
| 5,742,503 A | 4/1998 | Yu |
| 5,742,522 A | 4/1998 | Yazici et al. |
| 5,767,494 A | 6/1998 | Matsueda et al. |
| 5,801,371 A | 9/1998 | Kahn et al. |
| 5,805,448 A | 9/1998 | Lindsay et al. |
| 5,808,725 A | 9/1998 | Moberg et al. |
| 5,859,774 A | 1/1999 | Kuzuya et al. |
| 5,869,945 A | 2/1999 | Ha et al. |
| 5,886,335 A | 3/1999 | Matsueda |
| 5,886,422 A | 3/1999 | Mills |
| 5,912,541 A | 6/1999 | Bigler et al. |
| 5,914,924 A | 6/1999 | Takagi et al. |
| 5,917,428 A | 6/1999 | Discenzo et al. |
| 5,986,989 A | 11/1999 | Takagi et al. |
| 6,006,170 A | 12/1999 | Marcantonio et al. |
| 6,041,287 A | 3/2000 | Dister et al. |
| 6,054,828 A | 4/2000 | Hill |
| 6,072,653 A | 6/2000 | Goker |
| 6,081,751 A | 6/2000 | Luo et al. |
| 6,107,600 A | 8/2000 | Kurosawa et al. |
| 6,144,011 A | 11/2000 | Moss et al. |
| 6,198,176 B1 | 3/2001 | Gillette |
| 6,198,246 B1 | 3/2001 | Yutkowitz |
| 6,199,018 B1 | 3/2001 | Quist et al. |
| 6,211,484 B1 | 4/2001 | Kaplan et al. |
| 6,211,639 B1 | 4/2001 | Meister et al. |
| 6,211,640 B1 | 4/2001 | Fujisaki et al. |
| 6,243,350 B1 | 6/2001 | Knight et al. |
| 6,256,121 B1 | 7/2001 | Lizotte et al. |
| 6,259,221 B1 | 7/2001 | Yutkowitz |
| 6,275,319 B1 | 8/2001 | Gadhok |
| 6,281,650 B1 | 8/2001 | Yutkowitz |
| 6,304,359 B1 | 10/2001 | Gadhok |
| 6,317,637 B1 | 11/2001 | Limroth |
| 6,350,239 B1 | 2/2002 | Ohad et al. |
| 6,353,766 B1 | 3/2002 | Weinzierl |
| 6,424,873 B1 | 7/2002 | Przybylski |
| 6,442,444 B2 | 8/2002 | Matsubara et al. |
| 6,445,962 B1 | 9/2002 | Blevins et al. |
| 6,449,564 B1 * | 9/2002 | Kliman et al. ................ 702/35 |
| 6,453,722 B1 | 9/2002 | Liu et al. |
| 6,463,352 B1 | 10/2002 | Tadokoro et al. |
| 6,496,782 B1 | 12/2002 | Claus et al. |
| 6,510,353 B1 | 1/2003 | Gudaz et al. |
| 6,577,907 B1 | 6/2003 | Czyszczewski et al. |
| 6,622,099 B2 | 9/2003 | Cohen et al. |
| 6,643,080 B1 | 11/2003 | Goodner, III et al. |
| 6,646,397 B1 | 11/2003 | Discenzo |
| 6,697,685 B1 | 2/2004 | Caldwell |
| 6,721,445 B1 * | 4/2004 | Azencott ..................... 382/160 |
| 6,727,725 B2 | 4/2004 | Devaney et al. |
| 6,774,601 B2 * | 8/2004 | Schwartz et al. ........... 318/727 |
| 6,782,296 B2 | 8/2004 | Hoche |
| 6,812,668 B2 | 11/2004 | Akiyama |
| 6,822,415 B1 | 11/2004 | Komiya et al. |
| 6,826,519 B1 | 11/2004 | Fujino |
| 6,850,812 B2 | 2/2005 | Dinauer et al. |
| 6,853,951 B2 * | 2/2005 | Jarrell et al. ................. 702/181 |
| 6,876,167 B1 | 4/2005 | Jones |
| 6,885,972 B2 * | 4/2005 | Samata et al. ............... 702/182 |
| 6,895,352 B2 | 5/2005 | Josselson et al. |
| 6,937,908 B2 | 8/2005 | Chang et al. |
| 7,039,557 B2 * | 5/2006 | Mayer et al. ................ 702/184 |
| 2001/0011550 A1 | 8/2001 | Zheng |
| 2002/0049513 A1 | 4/2002 | Nussbaum et al. |
| 2003/0097193 A1 | 5/2003 | Makino et al. |
| 2003/0128240 A1 | 7/2003 | Martinez et al. |
| 2003/0163296 A1 | 8/2003 | Richards |
| 2004/0135534 A1 | 7/2004 | Cullen |
| 2005/0174124 A1 | 8/2005 | Huang |
| 2005/0228512 A1 | 10/2005 | Chen et al. |
| 2005/0251271 A1 | 11/2005 | Cutler |

FOREIGN PATENT DOCUMENTS

| | | |
|---|---|---|
| DE | 2629473 | 4/1979 |
| DE | 3505681 | 8/1985 |
| DE | 3520189 | 12/1986 |
| DE | 4211213 | 10/1993 |

| | | |
|---|---|---|
| EP | 0260138 | 3/1988 |
| EP | 0378093 | 7/1990 |
| EP | 0339402 | 6/1993 |
| EP | 896265 | 7/1998 |
| EP | 1283593 | 2/2003 |
| EP | 1298511 | 4/2003 |
| FR | 2600789 | 12/1987 |
| GB | 951785 | 3/1964 |
| JP | 63190584 | 8/1988 |
| JP | 01224189 | 9/1989 |
| JP | 04229088 | 8/1992 |
| JP | 05036851 | 2/1993 |
| JP | 07114402 | 5/1995 |
| JP | 2000028955 | 1/2000 |
| JP | 2000-330641 | 11/2000 |
| JP | 2001142917 | 5/2001 |
| JP | 2001-245488 | 9/2001 |
| JP | 2002199147 | 7/2002 |
| JP | 2003044111 | 2/2003 |
| WO | WO93/18525 | 9/1993 |
| WO | WO09917282 | 4/1999 |
| WO | WO01/33303 | 5/2001 |
| WO | WO01/64591 | 9/2001 |
| WO | WO03/097290 | 11/2003 |

OTHER PUBLICATIONS

Scanlab, Smart Scanning-inteliScan 10, Aug. 2003, SCANLAB America, Inc., Cincinnati, Ohio.

Lasesys Corporation, Series LBS-6000 Galvanometric Scanners, Feb. 6, 2004, http:www.lasesys.com/galvanometric.html.

Phototonics Spectra, Cambridge Technology Inc. Digital Control Center DC900, Jul. 2003, http://www.photonics.com/spectra/minimag/XQ/ASP/minimagid.70/QX/read.htm.

Birou et al., "Real-time robot drive control with PM-synchronous motors using a DSP-based computer system," Power Electronics and Motion Control Conference, 2000. Proceedings. PIEMC 2000. The Third International Aug. 15-18, 2000, Piscataway, NJ, USA, IEEE, vol. 3, Aug. 15, 2000, pp. 1290-1295.

B.A. Brandin, "A digital approach to the disturbance-accommodation problem," Transactions of the Institute of Measurement and Control, vol. 10, No. 5, Oct. 1988, London, UK, pp. 273-280.

C.C. Hang et al., "On-Line Auto Tuning of PID Controllers Based on the Cross-Correlation Technique," IEEE Transactions on Industrial Electronics, vol. 38, No. 6, Dec. 1991, New York, US, pp. 428-437.

C.C. Hang et al., "Development of An Intelligent Self-Tuning PID Controller," Advances in Instrumentation and Control, vol. 47, No. 2, Jan. 1992, Research Triangle Park, US, pp. 1101-1111.

Levy, G.F.: "Numeric Activex Components" Software Practice & Experience, John Wiley & Sons Ltd, Chichester, GB, vol. 31, No. 2, Feb. 2001, p. 147-189.

Huang GQ et al.: "Web-based product and process data modeling in concurrent 'design for X'" Robotics and Computer Integrated Manufacturing, Pergamon Press, Oxford, GB, vol. 15, No. 1, Feb. 1999, p. 53-63.

Datasheets for Copley Controls Corp., 2002 (4 pages).

"Digital Servoamplifier Upgrades Brush Motor Drive Systems," Copley Controls Corp., New Product Release dated Apr. 28, 2002, pp. 1-7.

Y. Tzou, "Auto-tuning Control of Self-Commissioning Electric Drives," Power Electronics and Mechatronics Control Lab., Dept. of Electrical & Control Engineering, National Chiao Tung Univ., Taiwan, pp. 483-487, no date.

Opposition Communication dated Jan. 3, 2006 and translation of pending claims in opposition proceeding regarding EP 896265.

* cited by examiner

SYSTEM AND METHOD FOR DIAGNOSING A CONTROLLER IN A LIMITED ROTATION MOTOR SYSTEM

The present application claims priority to U.S. Provisional Patent Application Ser. No. 60/538,842 filed Jan. 23, 2004, and claims priority to U.S. Provisional Patent Application Ser. No. 60/575,255 filed May 28, 2004, and claims priority to U.S. Provisional Patent Application Ser. No. 60/613,962 filed Sep. 28, 2004.

BACKGROUND

The present invention generally relates to limited rotation motor systems, and relates in particular to systems and methods for designing and adjusting limited rotation motor systems.

Limited rotation motors generally include stepper motors and constant velocity motors. Certain stepper motors are well suited for applications requiring high speed and high duty cycle sawtooth scanning at large scan angles. For example, U.S. Pat. No. 6,275,319 discloses an optical scanning device for raster scanning applications.

Limited rotation motors for certain applications, however, require the rotor to move between two positions with a precise and constant velocity rather than by stepping and settling in a sawtooth fashion. Such applications require that the time needed to reach the constant velocity be as short as possible and that the amount of error in the achieved velocity be as small as possible. Constant velocity motors generally provide a higher torque constant and typically include a rotor and drive circuitry for causing the rotor to rotate about a central axis, as well as a position transducer, e.g., a tachometer or a position sensor, and a feedback circuit coupled to the transducer that permits the rotor to be driven by the drive circuitry responsive to an input signal and a feedback signal. For example, U.S. Pat. No. 5,424,632 discloses a conventional two-pole limited rotation motor.

A limited rotation torque motor may be modeled or represented by a double-integrator model plus several flexible modes and low frequency non-linear effects. A typical closed-loop servo system for a galvanometer includes integral actions for low frequency uncertainties and a notch filter for high frequency resonant modes. System operation is chosen at the mid-frequency range where the system is well modeled by the rigid body. For a double integrator rigid body model, there is a direct relationship between the open-loop gain and the cross-over frequency on the frequency response plot. For example, an automatic tuning system for a servowriter head positioning system is disclosed in *Autotuning of a servowriter head positioning system with minimum positioning error*, Y. H. Huang, S. Weerasooriya and T. S. Low, J. Applied Physics, v. 79 pp. 5674–5676 (1996).

FIG. 1 shows a limited rotation torque motor system 10 of the prior art. The system 10 includes a controller 12 (e.g., a position, integral, derivative or PID controller) that receives an input command 14. The controller 12 provides a control signal to a motor 16, which moves an optical element such as a mirror to provide position changes 18 responsive to the input command 14. The system also includes a position detector 20 that provides a position detection signal 22 that is also provided to the controller 12 with the input command 14. Open-loop gain (or 0 dB cross-over variations) of the system affects closed-loop system performance if the controller is not adaptive to these variations.

Such limited rotation motors may be used, for example, in a variety of laser scanning applications, such as high speed surface metrology. Further laser processing applications include laser spot welding (for example high speed spot welding), surface treatment, cutting, drilling, marking, trimming, laser repair, rapid prototyping, forming microstructures, or forming dense arrays of nanostructures on various materials.

Limited rotation torque motors, however, eventually fail after finite usage. As methodologies are developed to drive limited rotation motors harder, failure may come at unanticipated times. The ability to gauge the condition of a limited rotation motor is helpful in predicting the life of a motor. Moreover, it is desirable to be able to gauge the condition of a limited rotation motor in situ without requiring that the motor be return to the manufacturer for analysis.

There is a need, therefore, for a method of monitoring a limited rotation torque motor, and more particularly, there is a need for a method of diagnosing the health and life of a limited rotation torque motor.

SUMMARY

In accordance with an embodiment, the invention provides a diagnostic system for analyzing a limited rotation motor system. The diagnostic system includes a first transform unit, a second transform unit, a closed loop frequency response unit, and a diagnostic system. The first transform unit is for receiving a first digital signal that is representative of a motor control signal, and is for providing a motor control frequency domain signal that is representative of a frequency domain representation of the motor control signal. The second transform unit is for receiving a second digital signal that is representative of a position detection signal, and is for providing a position detection frequency domain signal that is representative of a frequency domain representation of the position detection signal. The closed loop frequency response unit is for identifying a representation of the frequency response of the limited rotation motor responsive to the position detection frequency domain signal and the motor control frequency domain signals. The diagnostic unit is for comparing the representation of the frequency response with a previously recorded representation of a prior frequency response to identify an error condition with respect to the limited rotation motor system.

BRIEF DESCRIPTION OF THE DRAWINGS

The following description may be further understood with reference to the accompanying drawings in which.

Figure 1:
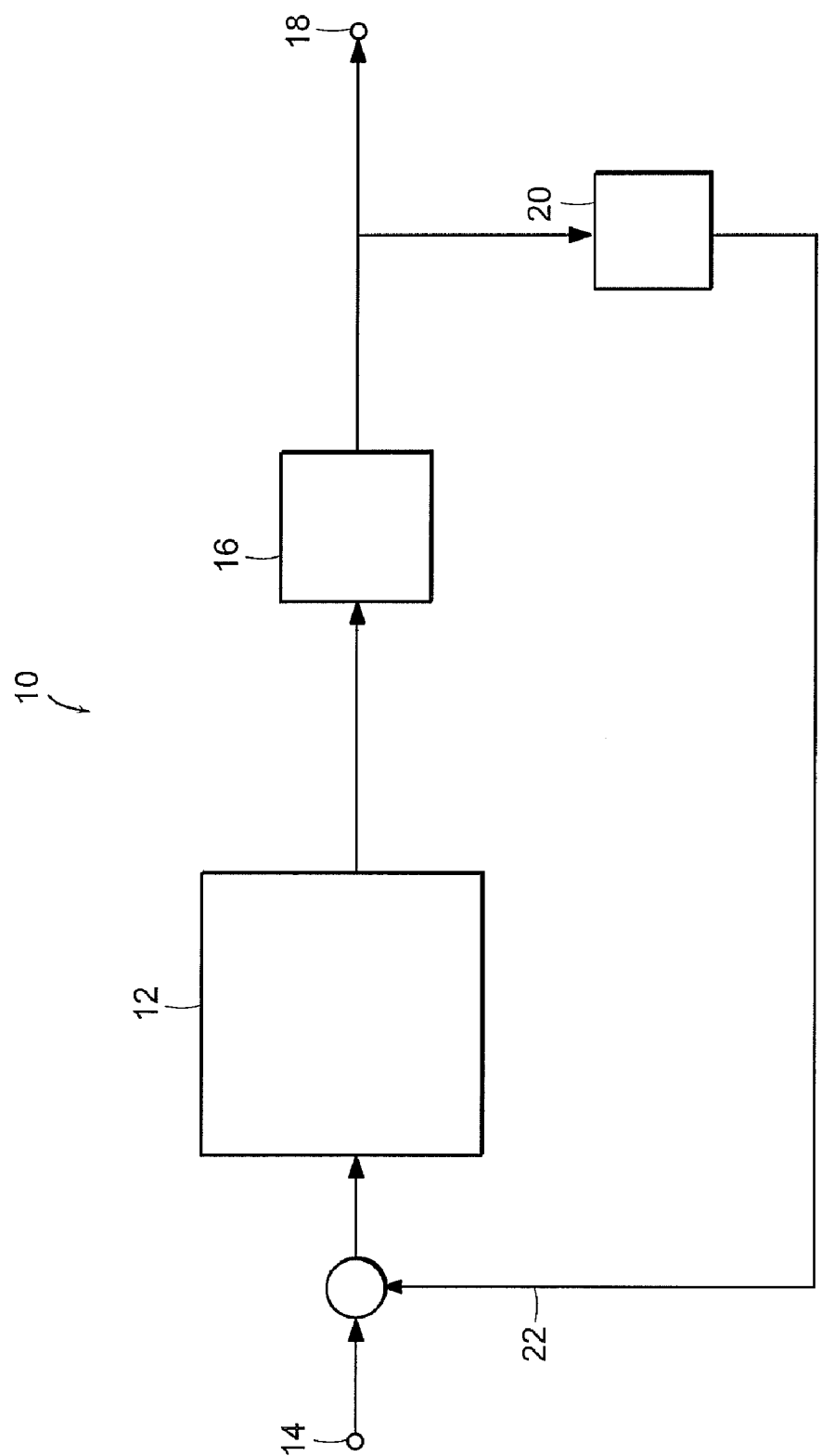
FIG. 1 shows an illustrative diagrammatic functional view of a limited rotation motor and control system in accordance with the prior art.

The drawings are shown for illustrative purposes only.

DETAILED DESCRIPTION OF THE ILLUSTRATED EMBODIMENTS

In accordance with various embodiments of the invention, limited rotation motor performance data is captured from a motor system, and that data is analyzed to determine a diagnosis of a variety of conditions that may negatively impact the performance of the system. In an embodiment, a Bode plot of the magnitude of an output signal responsive to an input sign wave is determined for all operating frequencies. This plot is determined over a very small range (e.g., <1 degree). Another plot may be determined either for the same range at a later time, or at a different range. Comparing these plots yields useful information regarding the galvanometer system. For example, inconsistencies at low frequencies over time for the same range may indicate an imminent bearing failure. Inconsistencies at middle frequencies over time may indicate a significant loss in torque constant. Inconsistencies at different portions of the range (e.g., the +1 to +20 degree range as compared to the −1 to −20 degree range) may indicate asymmetrical performance.

A common cause of failure in limited rotation motors is bearing failure, which typically occurs gradually over time. Other problems during operation may include changes in the torque constant or changes in the symmetry of the response of the motor with respect to a zero angle position.

In accordance with various embodiments of the invention, limited rotation motor performance data is captured from a motor system. A pseudo random binary sequence (PRBS) excitation signal is input to the system. The signal that is input to the motor (the motor input signal) is recorded, and the position signal that is received from the position detector (the PD signal) is also recorded. A Fast Fourier Transform (FFT) is performed on each signal, and a frequency response representation for the PD signal is compared to the frequency response representation for the motor input signal by taking the ratio of these two representations. The ratio provides a sequence (the ratio sequence) that represents the open loop frequency response for the system. The open loop frequency response may be provided in a Bode plot of the magnitude versus frequency. A mathematical system model may then be generated that represents the transfer function of the motor system. Knowing the mathematical model for a motor system at a particular time and angular range of movement, permits a diagnosis system to compare the mathematical model with the model for other earlier times, and/or with other positions along the range of rotation of the rotor.

The system provides that the identification of the open loop cross over frequency variations in the motor system may be identified automatically (even via a remote digital network). The automatic identification may be performed closed-loop so that system stability is not affected during the procedure. A data collection procedure may be performed in milliseconds.

An automatic identification system in accordance with an embodiment of the invention may involve system excitation using a pseudo random binary sequence (PRBS), then conducting a Fast Fourier Transform on the captured time responses. The system identification is then modeled using the FFT data.

Figure 2:
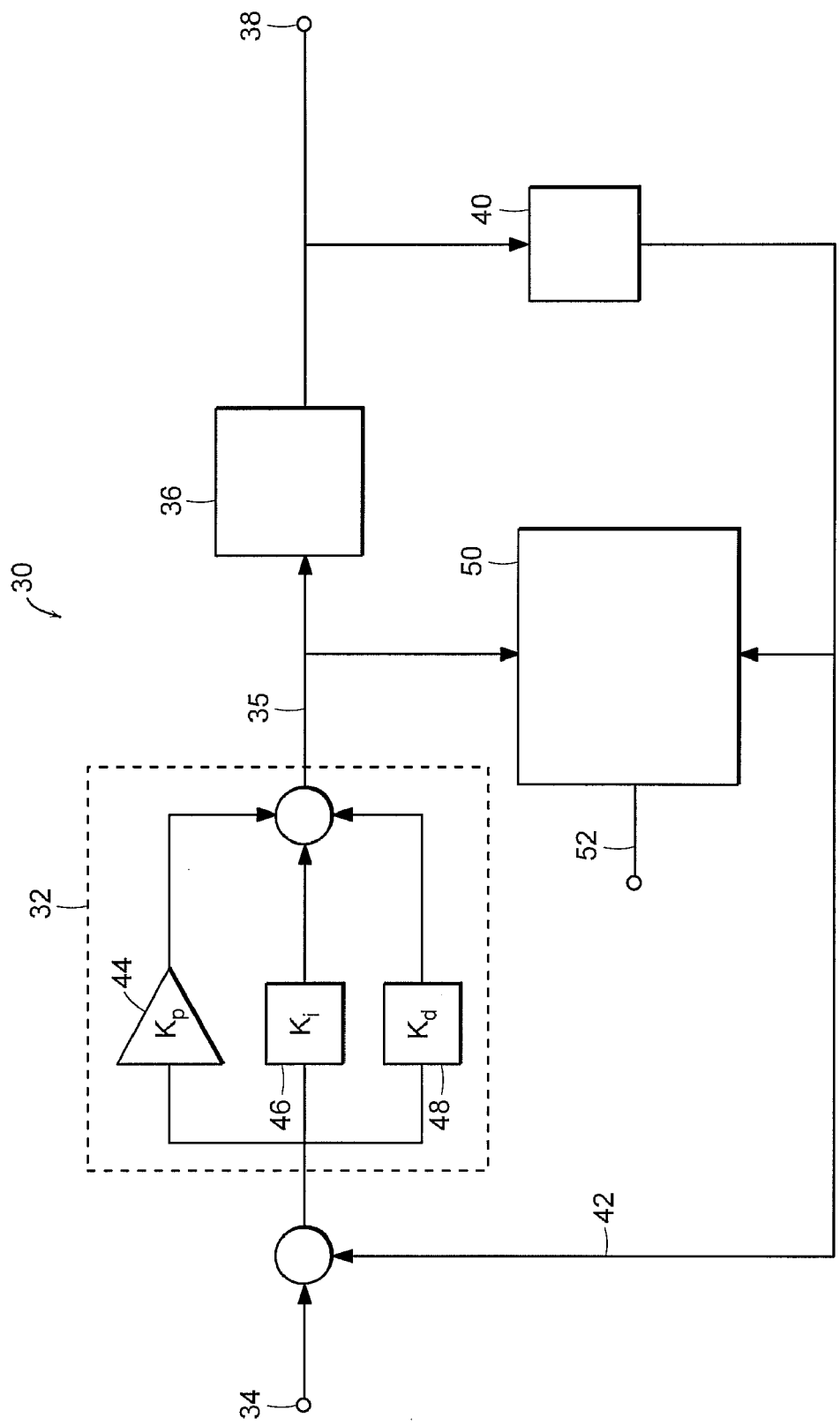
FIG. 2 shows an illustrative diagrammatic functional view of a limited rotation motor and diagnostic system in accordance with an embodiment of the invention.

FIG. 2 shows an illustrative diagrammatic view of a system 30 in accordance with an embodiment of the invention. The system 30 includes a PID controller 32 that receives an input command 34. The controller 32 provides a control signal 35 to a motor 36, which moves an optical element such as a mirror to provide position changes 38 responsive to the input command 34. The system 30 also includes a position detector 40 that provides a position detection signal 42 that is also provided to the controller 42 with the input command 34. The controller 32 includes proportional amplifier 44 ($k_p$), an integrating element 46 ($k_i$), and a derivative element 48 ($k_d$). The system also includes a diagnosis unit 50 that receives the motor control signal that is provided by the controller 32 and the position detection signal 42, and outputs an error signal 52. The motor control signal and the position detection signal are provided in digital form to a FFT converter within the diagnosis unit 50 to determine the closed loop frequency responses, and the open loop frequency response is derived from the closed loop frequency response.

Figure 3A:
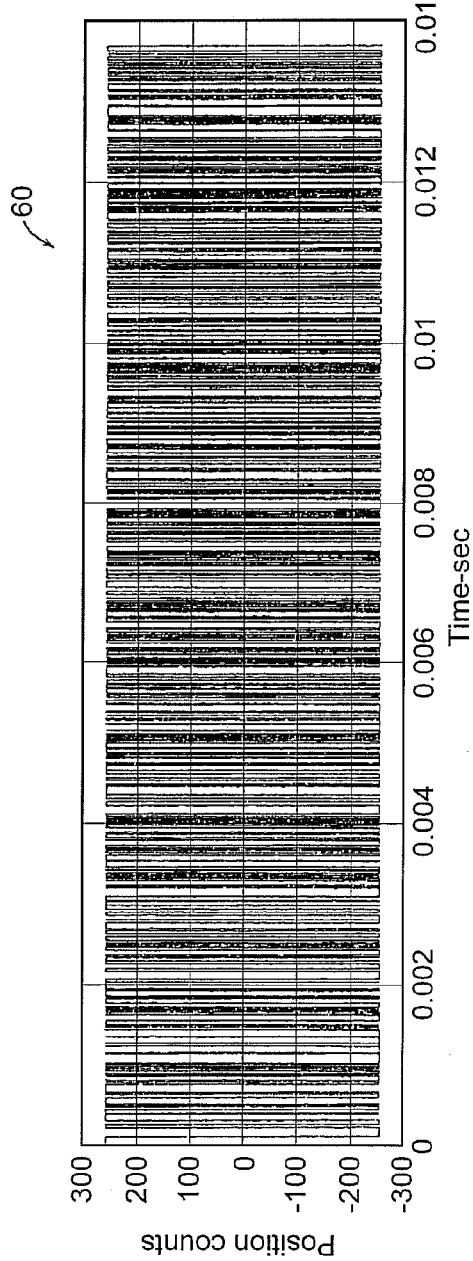
FIGS. 3A and 3B show illustrative graphical representations of a pseudo random binary sequence excitation signal that is provided to a motor controller, and the associated position detection signal that is produced by the motor in response to the pseudo random binary sequence.
Figure 3B:
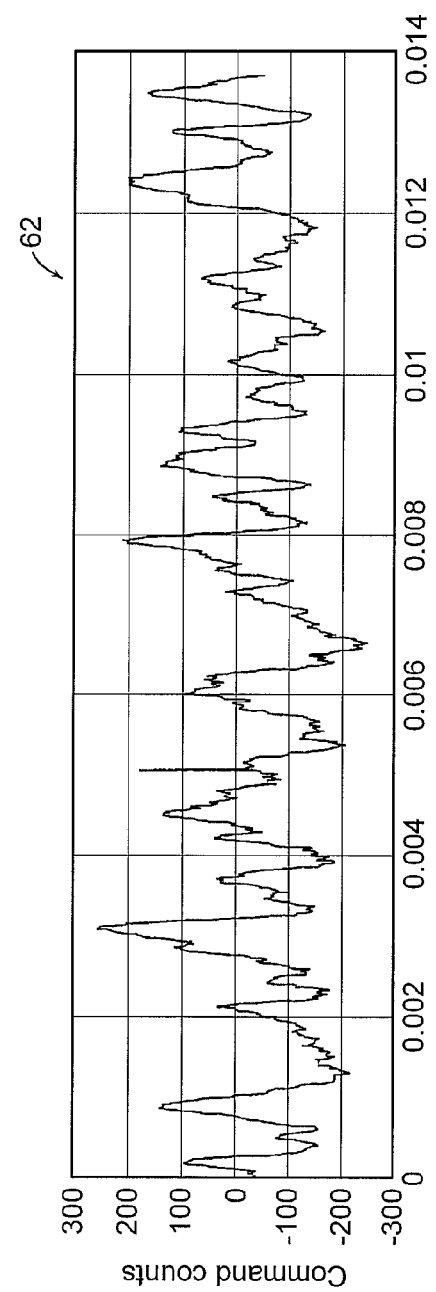

In particular, a pseudo random binary sequence (PRBS) is input to the system either as the input command 34 or is provided as a perturbation to the output of the controller 32. The data points for the PRBS excitation signal may be powers of twos. FIG. 3A shows at 60 a PRBS signal, and FIG. 3B shows at 62 a position detection provided by the motor in response to the PRBS signal shown in FIG. 3A. The input process may capture, for example, 1024 data points for each input signal. In further embodiments other types of excitation signals may be used, such as a while noise generator excitation signal, a Guassian noise generator excitation signal, or a swept sine excitation signal that provides a sine signal at all frequencies.

Figure 4:
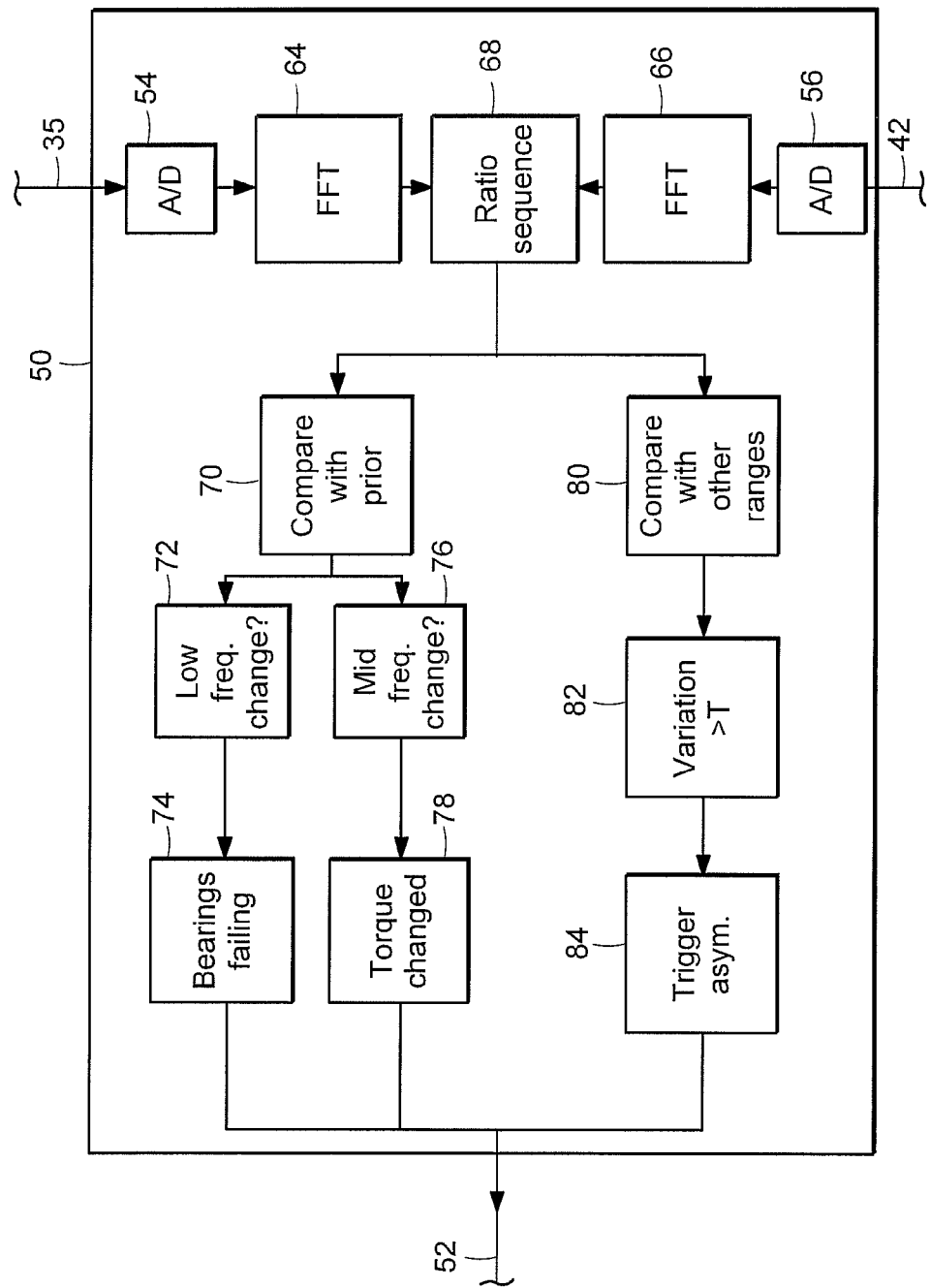
FIG. 4 shows an illustrative diagrammatic representation of a diagnosis unit in accordance with an embodiment of the invention.
Figure 5:
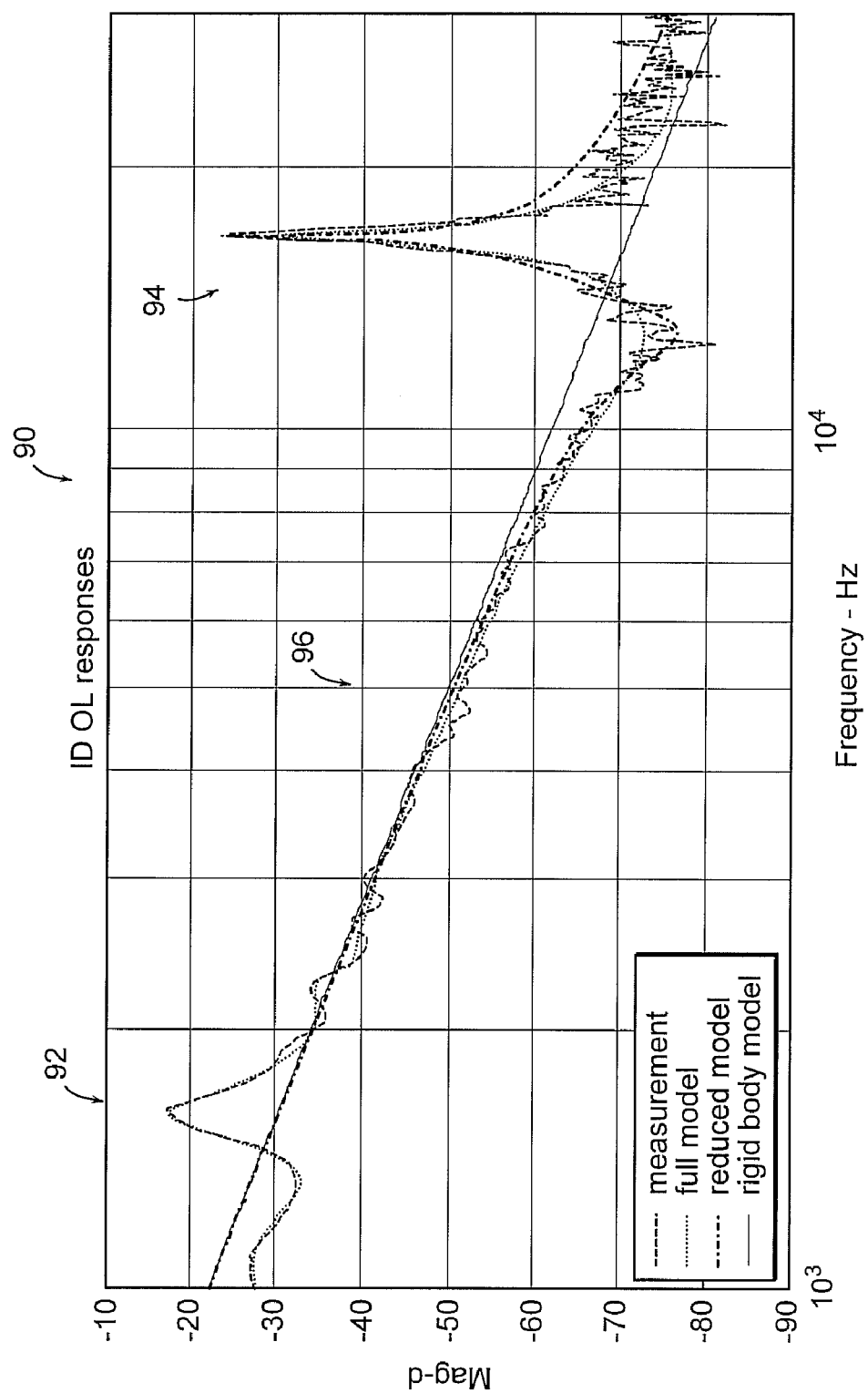
FIG. 5 shows an illustrative graphical representation of a measured frequency response of a system in accordance with an embodiment of the invention.

As shown in FIG. 4, the captured control signal 35 and position detection signal 42 may be converted to digital signals by A/D converters 54 and 56 is either signal is not already in digital form. Once the input signals are in digital form, they may be transmitted any distance, for example, via a network, and the output PID adjustment signals may also be transmitted via a network in a digital environment. The digital input time domain signals are then converted to frequency domain representations of the signals by FFT converter units 64 and 66 respectively. Each FFT provides a complex polynomial of the form $a_0 w_0, a_1 w_1, a_2 w_2 \ldots a_n w_n$, where n may, for example, be 512. A sequence of the ratios of the values $a_0, a_1, a_2 \ldots a_n$ for the position detection signal 42 over the respective values $a_0, a_1, a_2 \ldots a_n$ for the control signal yields a sequence of magnitudes $m_0, m_1, m_2 \ldots m_n$. This ratio sequence is provided by the ratio sequence unit 68. These magnitudes $m_0, m_1, m_2 \ldots m_n$ provide the open loop frequency responses for the system and may be plotted in graphical form as shown at 90 in FIG. 5. As shown in FIG. 5, the system may experience some distortion at low frequencies 92, some harmonic resonance at high frequencies 94, and may be operated in the mid frequency range 96. The data collection procedure may require very little time, for example 13.44 μsec for a 1024 PBRS sequence.

Figure 6:
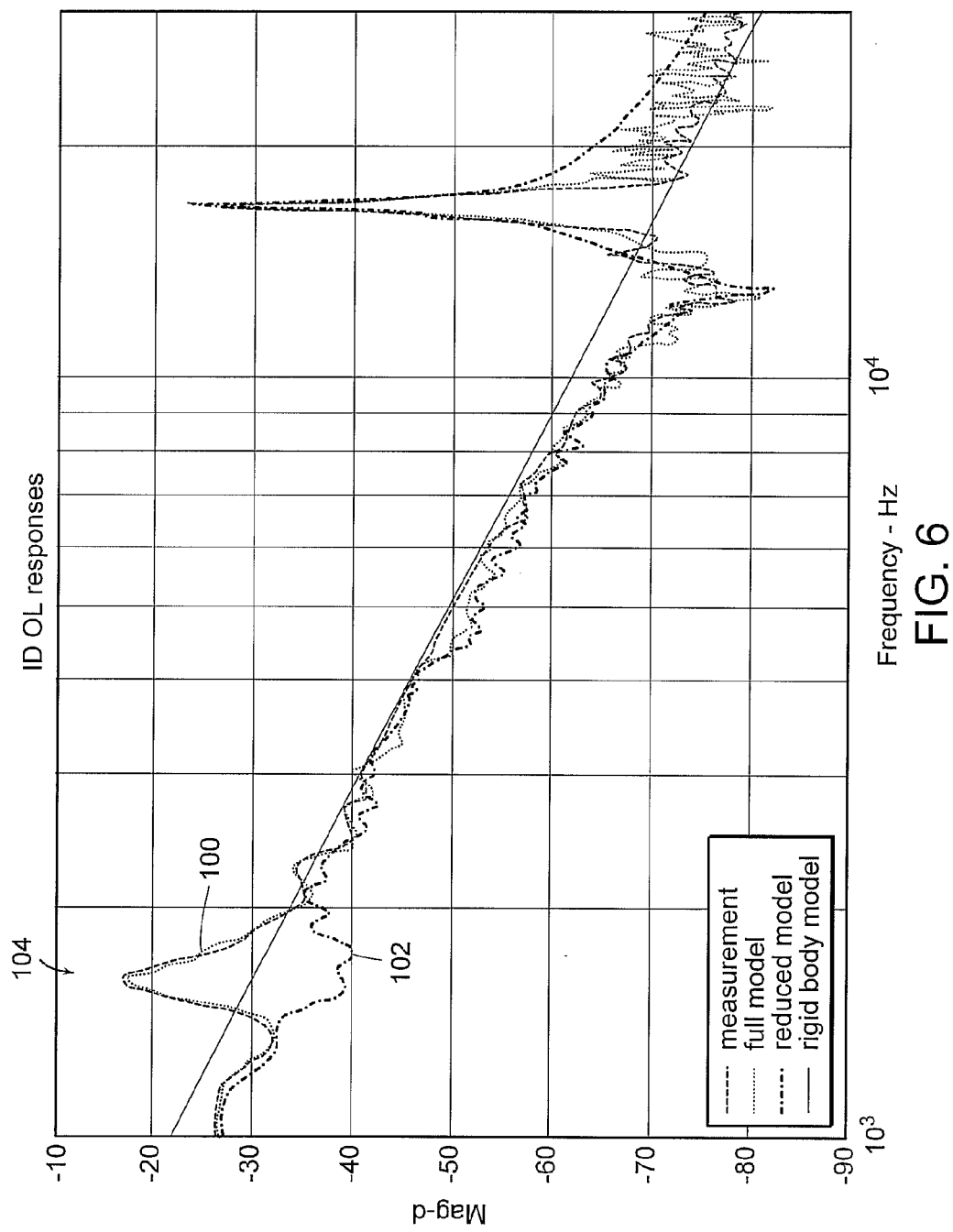
FIG. 6 shows illustrative graphical representations of measured frequency responses that show a change in low frequency response in accordance with certain embodiments of the invention.

Having determined the open loop frequency responses, the system may then store these responses for later comparison to identify changes that occur over time. In particular, the system may periodically generate the closed loop frequency responses and compare the current response with a prior response as determined at the comparison unit 70. If a significant change occurs in the low frequency range (as determined by low frequency analysis unit 72), then the system will identify that a potential problem exists in the bearings as shown at 74. FIG. 6 shows two closed loop frequency responses 100 and 102. The response 100 is recorded at a time prior to the response 102. As shown in FIG. 6, a significant change occurs in the low frequency range as shown at 104, indicating that the bearings are beginning to fail.

Figure 7:
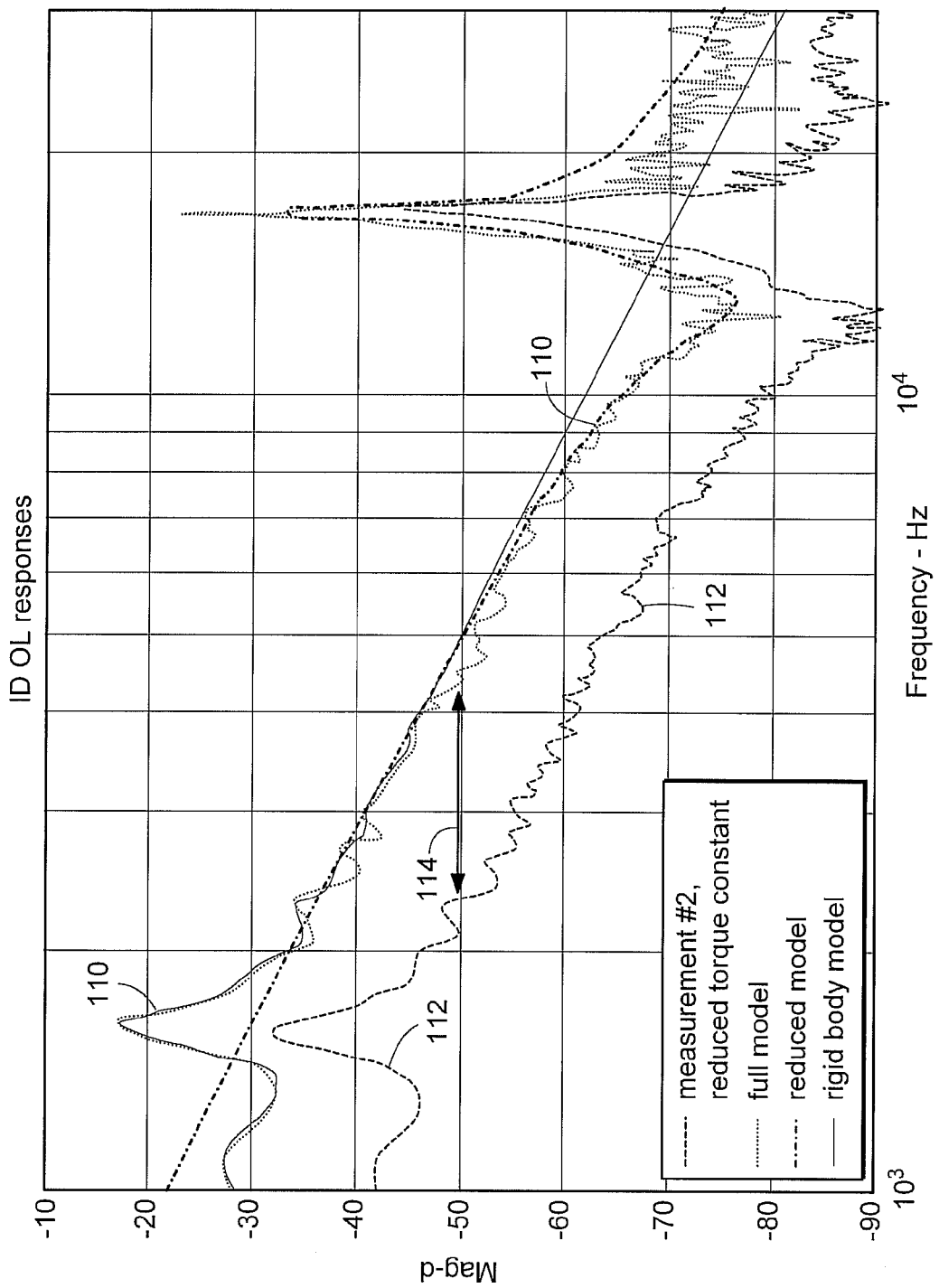
FIG. 7 shows illustrative graphical representations of measured frequency responses that show a change in torque constant in accordance with another embodiment of the invention.

If a significant change occurs in the mid frequency range (as determined by mid frequency analysis unit 76), then the system will identify that the torque constant has changed as shown at 78. FIG. 7 shows two closed loop frequency responses 110 and 112. The response 110 is recorded at a time prior to the response 112. As shown in FIG. 7, a significant change occurs at a designated magnitude crossover point due to the shift in the response curve as indicated at 114. Such a change in cross-over is indicative of a change in the torque constant of the system.

Figure 8:
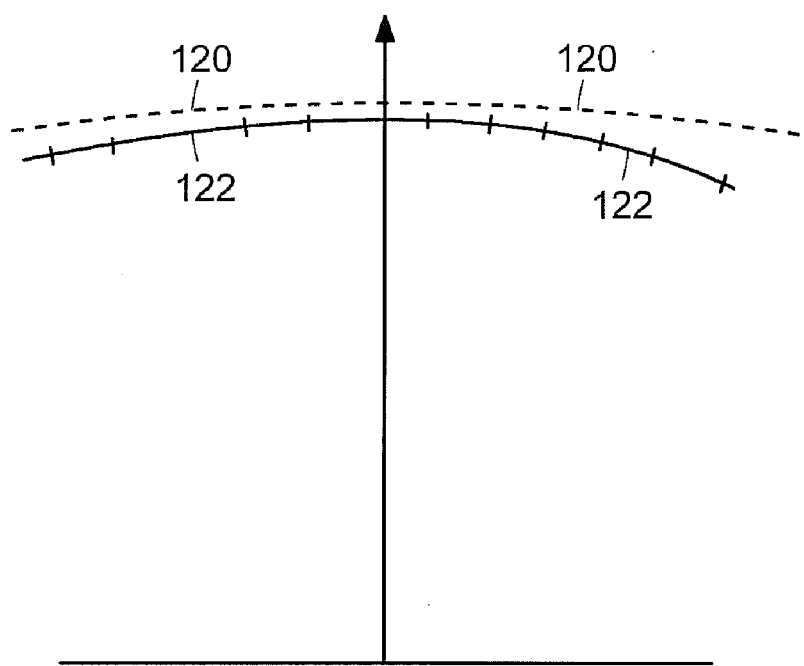
FIG. 8 shows illustrative graphical representations of measured frequency responses that show asymmetrical performance in accordance with a further embodiment of the invention and FIG. 9 shows an illustrative diagrammatic functional view of a limited rotation motor and diagnostic system in accordance with a further embodiment of the invention.

The system may also compare the closed loop frequency response with closed loop frequency responses for other portions of the range (e.g., +20 degrees to −20 degrees). If the closed loop frequency response is determined using less than one degree of range of movement, then many points along the range may be identified. As shown in FIG. 4, the closed loop frequency response may be compared (at comparator 80) with previously recorded (e.g., immediately previously recorded) closed loop frequency responses for other portions of the range. If the variation is greater than a threshold variation (as determined by unit 82), then an error condition is flagged by the asymmetry unit 84. For example, FIG. 8 shows an expected symmetrical torque constant representation 120 over the range of −20 degrees to +20 degrees, as well as a measured torque constant representation 122 over the same range. As shown, the measured torque constant is not symmetrical with respect to the zero angle over the −20 degrees to +20 degrees range, Such asymmetry may significantly negatively impact the performance of a limited rotation motor if undetected. Once detected, the system may either make adjustments to only use a portion of the range that is symmetrical with respect to its mid point, or may actually create PID adjustments for different portions of the range.

The diagnosis unit 50 then outputs an error signal 52 indicative of any of the existence of an error condition, such as a bearing being in poor condition, a change in torque constant, or an asymmetric condition.

Figure 9:
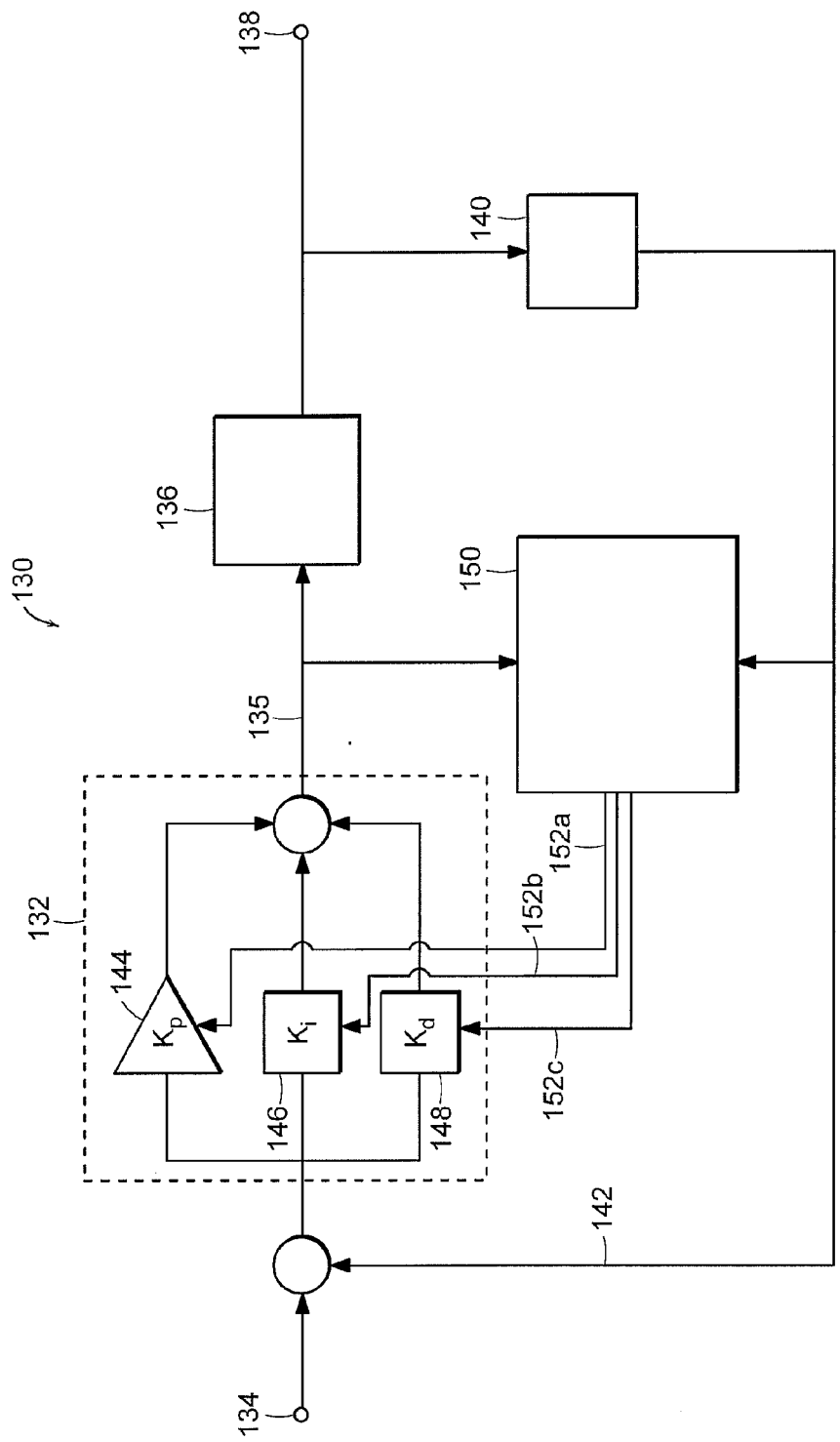

As shown in FIG. 9, a diagnostic system for a limited rotation motor system 130 in accordance with a further embodiment of the invention may include a PID controller 132 that receives an input command 134. The controller 132 provides a control signal 135 to a motor 136, which moves an optical element such as a mirror to provide position changes 138 responsive to the input command 134. The system 130 also includes a position detector 140 that provides a position detection signal 142 that is also provided to the controller 142 with the input command 134. The controller 132 includes proportional amplifier 144 ($k_p$), a integrating element 146 ($k_i$), and a derivative element 148 ($k_d$).

The system also includes a diagnosis unit 150 that receives the motor control signal that is provided by the controller 132 and the position detection signal 142. The motor control signal and the position detection signal are provided in digital form to a FFT converter within the diagnosis unit 150 to determine the closed loop frequency responses, and the open loop frequency response is derived from the closed loop frequency response.

In the embodiment of FIG. 9, the diagnosis unit 150 determines an appropriate adjustment for the PID controller to accommodate for changes that need to be made to the coefficients $k_p$, $k_i$ and $k_d$ for the proportional unit, the integral unit and/or the derivative unit respectively to correct for a detected error condition. For example, if an error condition is detected indicating that the torque constant has changed by an amount of for example a factor of two, then the $k_p$, $k_i$ and $k_d$ coefficients may each be increased by a factor of two as well. The system 130, therefore, provides that in the event of certain error conditions being identified, the system may also attempt to correct for the detected error conditions.

Those skilled in the art will appreciate that numerous modifications and variations may be made to the above disclosed embodiments without departing from the spirit and scope of the invention.

What is claimed is:

1. A diagnostic system for analyzing a limited rotation motor system, said diagnostic system comprising:

first transform means for receiving a first digital signal that is representative of a motor control signal, and for providing a motor control frequency domain signal that is representative of a frequency domain representation of the motor control signal;

second transform means for receiving a second digital signal that is representative of a position detection signal, and for providing a position detection frequency domain signal that is representative of a frequency domain representation of the position detection signal;

closed loop frequency response means for identifying a representation of the frequency response of the limited rotation motor responsive to the motor control frequency domain signal and the position detection frequency domain signal; and diagnostic means for comparing the representation of the frequency response with a previously recorded representation of a prior frequency response to identify an error condition with respect to the limited rotation motor system.

2. The system as claimed in claim 1, wherein said first transform means and said second transform means each perform a Fast Fourier Transform.

3. The system as claimed in claim 1, wherein said representation of the frequency response identified by the closed loop frequency response means includes a ratio of the position detection frequency domain signal and the motor control frequency domain signal.

4. The system as claimed in claim 3, wherein said ratio is provided by the position detection frequency domain signal divided by the motor control frequency domain signal.

5. The system as claimed in claim 1, wherein said diagnostic means compares a low frequency range of the frequency response with the prior frequency response.

6. The system as claimed in claim 5, wherein said diagnostic means provides a failed bearing error signal that is indicative of whether a bearing is at risk of failing.

7. The system as claimed in claim 1, wherein said diagnostic means compares a mid frequency range of the frequency response with the prior frequency response.

8. The system as claimed in claim 7, wherein said diagnostic means provides a torque constant error signal that is indicative of a change in torque constant of the limited rotation motor.

9. The system as claimed in claim 1, wherein said diagnostic means provides an asymmetry error signal that is indicative of whether the range of movement of a rotor shaft of the limited rotation motor is not symmetrical with respect to the torque constant.

10. The system as claimed in claim 1, wherein said limited rotation motor system includes a proportional, integral, derivative controller.

11. The system as claimed in claim 10, wherein said diagnostic means provides corrective signals to the proportional, integral, derivative controller.

12. A diagnostic system for analyzing a limited rotation motor system, said diagnostic system comprising:
    first FFT means for receiving a first digital signal that is representative of a motor control signal, and for providing a motor control frequency domain sequence that is representative of a frequency domain representation of the motor control signal for a plurality of frequencies;
    second FFT means for receiving a second digital signal that is representative of a position detection signal, and for providing a position detection frequency domain sequence that is representative of a frequency domain representation of the position detection signal for the plurality of frequencies;
    closed loop frequency response means for identifying a representation of the frequency response for the plurality of frequencies of the limited rotation motor responsive to the motor control frequency domain signal and the position detection frequency domain signal; and
    diagnostic means for comparing the representation of the frequency response with a previously recorded representation of a prior frequency response to identify an error condition with respect to the limited rotation motor system.

13. The system as claimed in claim 12, wherein said representation of the frequency response identified by the closed loop frequency response means includes a ratio of the position detection frequency domain signal and the motor control frequency domain signal.

14. The system as claimed in claim 13, wherein said ratio is provided by the position detection frequency domain signal divided by the motor control frequency domain signal.

15. The system as claimed in claim 12, wherein said diagnostic means compares a low frequency range of the frequency response with the prior frequency response.

16. The system as claimed in claim 15, wherein said diagnostic means provides a failed bearing error signal that is indicative of whether a bearing is at risk of failing.

17. The system as claimed in claim 12, wherein said diagnostic means compares a mid frequency range of the frequency response with the prior frequency response.

18. The system as claimed in claim 17, wherein said diagnostic means provides a torque constant error signal that is indicative of a change in torque constant of the limited rotation motor.

19. The system as claimed in claim 12, wherein said diagnostic means provides an asymmetry error signal that is indicative of whether the range of movement of a rotor shaft of the limited rotation motor is not symmetrical with respect to the torque constant.

20. The system as claimed in claim 12, wherein said limited rotation motor system includes a proportional, integral, derivative controller.

21. The system as claimed in claim 20, wherein said diagnostic means provides corrective signals to the proportional, integral, derivative controller.

* * * * *